(12) United States Patent
Soussan et al.

(10) Patent No.: US 8,822,330 B2
(45) Date of Patent: Sep. 2, 2014

(54) METHOD FOR PROVIDING OXIDE LAYERS

(75) Inventors: Philippe Soussan, Marseilles (FR); Eric Beyne, Leuven (BE); Philippe Muller, Purteaux (FR)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/906,766

(22) Filed: Oct. 18, 2010

(65) Prior Publication Data

US 2011/0086507 A1    Apr. 14, 2011

Related U.S. Application Data

(63) Continuation of application No. PCT/EP2009/055312, filed on Apr. 30, 2009.

(60) Provisional application No. 61/050,092, filed on May 2, 2008.

(51) Int. Cl.
*H01L 21/4763*   (2006.01)
*H01L 21/02*     (2006.01)
*H01L 21/316*    (2006.01)

(52) U.S. Cl.
CPC ...... *H01L 21/3167* (2013.01); *H01L 21/02258* (2013.01); *H01L 21/02238* (2013.01); *H01L 21/31675* (2013.01)
USPC .................................. 438/637; 257/E21.557

(58) Field of Classification Search
CPC .................. H01L 2924/00; H01L 2924/00014; H01L 2224/48227; H01L 2224/32225; H01L 23/481

USPC .................................. 438/637; 257/E21.577
See application file for complete search history.

(56) References Cited

U.S. PATENT DOCUMENTS

| 4,081,823 | A | * | 3/1978 | Cook, Jr. ........................ 257/517 |
| 5,511,428 | A | * | 4/1996 | Goldberg et al. ............... 73/777 |
| 5,736,454 | A | * | 4/1998 | Hwu et al. ..................... 438/585 |
| 2001/0021566 | A1 | | 9/2001 | Zhang et al. |
| 2004/1180516 | | | 9/2004 | Watabe et al. |

FOREIGN PATENT DOCUMENTS

| DE | 10147894 | 2/2003 |
| DE | 10138981 | 3/2003 |
| WO | WO 00/75976 | 12/2000 |

OTHER PUBLICATIONS

International Search Report dated Mar. 31, 2009 for PCT/EP2009/055312.
Written Opinion dated Nov. 2, 2010 for PCT/EP2009/055312.

(Continued)

*Primary Examiner* — Tony Tran
(74) *Attorney, Agent, or Firm* — Knobbe, Martens Olson & Bear LLP

(57) ABSTRACT

A method for providing an oxide layer on a semiconductor substrate is disclosed. In one aspect, the method includes obtaining a semiconductor substrate. The substrate may have a three-dimensional structure, which may comprise at least one hole. The method may also include forming an oxide layer on the substrate, for example, on the three-dimensional structure, by anodizing the substrate in an acidic electrolyte solution.

17 Claims, 10 Drawing Sheets

(56) References Cited

OTHER PUBLICATIONS

Kaplan L H, Formation of Silicon Oxide Films by Anodic Oxidation of Silicon, IBM Technical Disclosure Bulletin, IBM Corp, vol. 7, No. 12, May 1, 1965.

Abu Hena Mostafa Kamal et al, Modified Constant—Current Anodization—a Promising Mechanism for Minimizing Interface States in the Silicon/Silicon-Oxide System of an Anodic Oxide Film, Journal of Electrochemical Society, vol. 141, No. 8, Aug. 1, 1994.

Mende et al, Optimization of Anodic Silicon Oxide Films for Low Temperature Passivation of Silicon Surfaces, Journal of the Electrochemical Society, vol. 140, No. 1, 1993.

* cited by examiner

METHOD FOR PROVIDING OXIDE LAYERS

CROSS-REFERENCE TO RELATED APPLICATIONS

This application is a continuation of PCT Application No. PCT/EP2009/055312, filed Apr. 30, 2009, which claims priority under 35 U.S.C. §119(e) to U.S. provisional patent application 61/050,092 filed on May 2, 2008. Each of the above applications is incorporated herein by reference in its entirety.

BACKGROUND OF THE INVENTION

1. Field of the Invention

The present disclosure relates to semiconductor processing. More particularly, the present disclosure relates to a method for providing an oxide layer at predetermined locations on a substrate, e.g. on a three-dimensional structure in a substrate, for example a three-dimensional structure having a high aspect ratio, for example an aspect ratio (width over height ratio) below about 5.

2. Description of the Related Technology

Silicon oxide is a know material to be used in semiconductor process technology. Several techniques exist to deposit or grow silicon oxide. Silicon oxide may be formed by thermal oxidation of silicon. Alternatively, chemical vapor deposition (CVD) may be used to form silicon oxide. By using this process, silicon oxide is formed by a chemical reaction in a process chamber at temperatures typically ranging from 200° C. to 500° C. For this purpose specific precursors such as e.g. silane (SiH4), TEOS (Tetraethyl Orthosilicate —Si(OC2H5)4) or HMDSO (hexamethyldisiloxane) are commonly used.

The quality (electrical and mechanical properties) of the formed oxide mainly depends on the amount of impurities trapped in the oxide during formation, and thus also depends on the technique used to form it. The impurities may, for example, result from incompletely dissociated precursors.

In order to obtain high quality oxide films at low temperature, plasma enhanced chemical vapor deposition (PECVD) may be used to efficiently dissociate the precursors.

Another way of forming silicon oxide is by electrochemical oxidation of silicon, such as anodization.

U.S. Pat. No. 5,736,454 describes a method for forming a silicon dioxide layer on a silicon substrate, e.g. a field oxide layer or the oxide layer of a thin film transistor. The method comprises conducting an electrolytic reaction at room temperature such that a silicon dioxide layer is formed on a silicon substrate acting as an anode, wherein pure water is used as an electrolyte of the electrolytic reaction. In order to obtain this, an aluminum film is evaporated at the backside of the silicon substrate to form the anodic contact for anodization. The method of U.S. Pat. No. 5,736,454 requires assist techniques in order to obtain good quality silicon oxide that can be used as, for example, a gate oxide. Therefore, the formed silicon dioxide layer is further subjected to a rapid thermal densification carried out in an inert gas atmosphere and at a temperature of between 700° C. and 1000° C. for a time period such that the silicon dioxide is densified. It is a disadvantage of the method described in U.S. Pat. No. 5,736,454 that it cannot be applied to thin wafers, which need to be attached to a carrier for handling, which carriers are non-conductive. It is furthermore a disadvantage of the method described in U.S. Pat. No. 5,736,454 that it is a slow process: 50 Å to 88 Å of oxide are formed in between 20 and 100 minutes.

PECVD deposition is typically performed at temperatures between 200° C. and 400° C. For advanced packaging applications, which covers 3D integration of IC and packages, typical deposition temperatures need to remain below 200°, preferably below 100° C. for example to allow processing on carrier wafers, that are typically glued with polymer based materials that cannot withstand these high temperatures. With PECVD, it is possible to deposit layers at temperatures below 200° C., often down to 80° C., but the oxide deposited at these temperatures exhibit poor properties, for example poor mechanical properties. The layers suffer from low breakdown field and pinholes. Also the conformity of the deposited layers is poor, i.e. the thickness of the deposited layer is not homogenous in deep 3D structures.

Oxidation of silicon appears to be a difficult process that may require post-treatment, additional assist techniques or specific substrate preparation in order to form good quality oxide. A good quality oxide for example has a parasitic leakage current below 100 nA/cm$^2$.

Furthermore, when a via structure is formed on a substrate, it may be difficult to provide an oxide inside these via structures because of lithographic limitations which are due to small depth of focus of scanners used for performing patterning and/or reflective effects.

SUMMARY OF CERTAIN INVENTIVE ASPECTS

Certain inventive aspects relate to a method for providing an oxide layer on a semiconductor substrate, for example on a three-dimensional (3D) structure on or in a semiconductor substrate, for example a silicon substrate.

According to a method according to particular embodiments of the disclosure, oxide layers may be formed on a 3D structure in or on a semiconductor substrate, e.g. at the sidewalls of trenches or holes in and/or at the sidewalls of pillars at a major surface of a semiconductor substrate.

A method according to embodiments of the disclosure may be applied at low temperatures, e.g. temperatures below about 80° C., for example room temperature.

In a first aspect, the present disclosure provides a method for providing an oxide layer on a semiconductor substrate, for example on a three-dimensional structure in or on a semiconductor substrate. The method comprises a) obtaining a semiconductor substrate, and b) forming an oxide layer on the substrate by anodizing the substrate in an acidic electrolyte solution.

In the particular embodiments that the substrate comprises a three-dimensional structure, such three-dimensional structure could, as examples only, be a cylindrical or donut-shaped hole for a through-substrate via (TSV). In alternative embodiments it could be any shape structured on the surface of the substrate, e.g. for forming a MEMS device. The three-dimensional structures include trenches, holes and/or pillars.

Anodizing the substrate in an acidic electrolyte solution may comprise immersing the substrate in an electrolyte solution which comprises any of citric acid, acetic acid, oxalic acid, sulfuric acid, phosphoric acid nitric acid or a combination thereof. According to embodiments of the present disclosure, the concentration of the acid in the electrolyte solution may be between about 0% (not included) and 20%, depending on the acid used and on particular circumstances.

It is an advantage of certain embodiments of the present disclosure that due to the acidic electrolyte solution the speed of the anodization is increased compared to using a non-acidic electrolyte solution. Hence thicker oxide layers may be obtained in less time. The speed of the anodization process depends on the acid concentration in the electrolyte solution.

With a method according to embodiments of the disclosure, oxide layers may be formed at predetermined locations, e.g. those locations where substrate is exposed to the electrolyte. Such predetermined locations may include parts of a three-dimensional structure, for example on a major surface of the three-dimensional structure and/or at sidewalls thereof, for example sidewalls of a trench or hole or via.

An advantage of the use of anodization is the realization of a uniform oxide thickness on the substrate surface exposed to the anodization electrolyte and the simultaneous reduction of the surface roughness. Etching of vertical trenches or vias in a substrate typically results in rough sidewalls (scallops). Sharp surface features on the substrate-surfaces (e.g. the scallops) result locally in higher electro-static fields, accelerating the anodic oxidation process at those locations and therefore smoothening the surface in a natural way. A smooth surface, or thus reduced roughness, of the oxide provides good electrical properties, such as for example improved resistance against breakdown.

Another advantage of a method according to certain embodiments of the disclosure is that it can be applied at low temperatures, e.g. below about 80° C., even below about 50° C., such as at room temperature.

A method according to certain embodiments of the disclosure may be used for forming vias, e.g. through-substrate vias, or MEMS devices.

Forming an oxide layer on the substrate according to certain embodiments of the present disclosure may be performed by a) immersing the substrate in the electrolyte solution, and b) applying a potential between a cathode located in the electrolyte solution and an anode formed on or by the substrate, thereby anodizing the substrate. If the substrate comprises a three-dimensional structure, this structure may be anodized with the substrate. By applying a potential, a current flows through the cell. As the anodic layer grows, a larger potential is required (at constant current) to keep the process going. When a pre-determined voltage is reached, a pre-determined oxide thickness is achieved. If that voltage is kept constant, the current will decrease exponentially during the remaining anodization time, during which defects in the anodized layer are healed and the oxide is densified.

In embodiments of the present disclosure, the oxide layer formed may be provided at the front side of the substrate. Applying a potential between a cathode and an anode may comprise applying a potential between a cathode and an anode located at the front side of the substrate. This has the advantage that the method may also be used with very thin substrates. Such thin substrates are, for convenience of handling, placed on a handling wafer. Such handling wafer is most often non-conductive. Due to the provision of a potential between the cathode and an anode at the front side of the substrate, the presence and type of handling wafer is of no concern for the anodization process.

The applied potential may be between about 10 V and 400V. The current should be high enough to start electrolysis of the electrolyte solution.

According to embodiments of the disclosure, applying a potential between a cathode located in the electrolyte solution and an anode formed on or by the substrate may be performed by applying a potential so as to change current density through the substrate as a function of time. Hence the applied potential may change as a function of time.

According to embodiments of the disclosure, anodization may be performed by a two-step process. According to these embodiments, applying a potential between a cathode located in the electrolyte solution and an anode formed on or by the substrate may be performed such that a) first a fixed current density is obtained through the substrate for a predetermined time period for forming the oxide layer, and b) after expiry of the predetermined time period, a fixed potential is obtained for healing the oxide layer.

With healing of the oxide layer is meant removal of defects such as pinholes so as to obtain an oxide layer of good quality.

In a further aspect, the present disclosure provides the use of a method according to embodiments of the present disclosure in a manufacturing process for semiconductor devices.

In yet another aspect, the present disclosure provides a substrate provided with an oxide layer, wherein the oxide layer is formed by a method according to embodiments of the present disclosure.

In still a further aspect, the present disclosure provides a three-dimensional structure on a substrate, the three-dimensional structure comprising at least one hole. The three-dimensional structure furthermore comprises an oxide layer on a major surface of the three-dimensional structure and/or at sidewalls of the at least one hole, the oxide layer being formed by a method according to certain embodiments of the present disclosure. It is particularly advantageous that the formed oxide layer is conformal in high aspect ratio three-dimensional structures, e.g. trenches. Known low temperature processes typically have less than about 10% step-coverage whereas an oxide layer formed in accordance with embodiments of the present disclosure is conformal like a CVD oxide, but contrary thereto is provided at low temperature.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
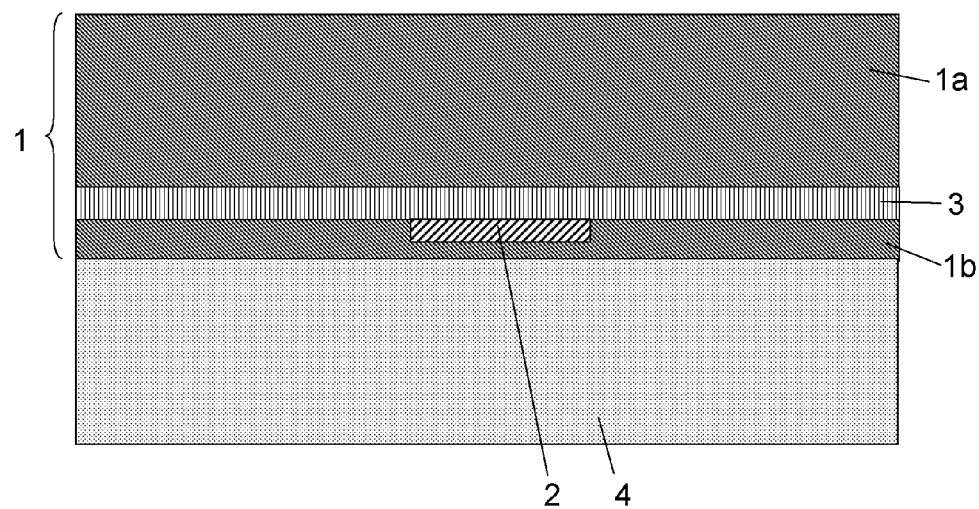
FIG. 1 to FIG. 4 illustrate subsequent steps in a method according to embodiments of the disclosure.

In the different figures, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Certain embodiments relate to the field of semiconductor processing, e.g. silicon processing, for example through-substrate via processing and semiconductor based MEMS technology. In one embodiment, the semiconductor may be silicon.

The present disclosure is described in detail with reference to a substrate provided with a three-dimensional structure, which is the examples described is a hole. This, however, is not intended to be limiting for the present disclosure. The disclosure can also be applied to substrates with three-dimensional structures which are pillars or which have a pillar-like shape, to substrates provided with other types of three-dimensional structures, or to plane substrates.

Provision of a conformal oxide layer on three-dimensional semiconductor structures, especially on vertical sidewalls of holes or protrusions, is very difficult, particularly for large aspect ratios (defined as the ratio of width dimension over height dimension of the three-dimensional structure, the width dimension being measured substantially in the plane of the substrate surface, and the height dimension being measured substantially perpendicular thereto), e.g. aspect ratios below about 5 and low temperature processing, e.g. processing at temperatures below about 80° C. Certain embodiments provide a method for providing an oxide layer on exposed semiconductor surface areas of a three-dimensional semiconductor, e.g. silicon, structure. The method comprises a) obtaining a semiconductor substrate lying in a plane and comprising a three-dimensional structure, the three-dimensional structure comprising at least one surface substantially perpendicular to the plane of the substrate, such as for example a hole or via, and b) forming an oxide layer on or in the three-dimensional structure by anodizing the substrate in an acidic electrolyte solution.

Anodization is an electrochemical process in which a surface is anodized by placing the surface into an electrolyte solution while applying a potential between a cathode (negative electrode) formed of an inert material and an anode (positive electrode). The anode can be the part to be treated or can be additionally provided onto the part to be treated. An oxide layer is then grown because of a direct current passing through the electrolyte solution as a consequence of the applied potential. This current releases hydrogen at the cathode and oxygen at a surface of the anode, thereby creating a build-up of the oxide layer.

Anodization allows growing oxides at room temperature. By using anodization oxide layers may be provided in holes or on protrusions of a three-dimensional (3D) structure. Therefore, by using anodization to provide an oxide layer in holes or on protrusions of the 3D structure, a method according to embodiments of the disclosure may overcome limitations of prior art processes such as chemical vapor deposition (CVD) techniques, and allows for process simplifications, and thus consequently for cost reduction.

According to embodiments of the present disclosure, the anodization process is carried out in an acidic electrolyte solution. The electrolyte solution may, for example, comprise any of citric acid, acetic acid, oxalic acid, sulfuric acid, phosphoric acid nitric acid or a combination thereof. It has been found that the acid component in the electrolyte solution speeds up the anodization process. Therefore, by using an acidic electrolyte solution, a thicker oxide can be grown in a particular time compared to an anodization process with same parameters (starting materials, current, temperature etc.) but using another, non-acidic, electrolyte solution. The more acidic the electrolyte solution, the faster the anodization process takes place.

Anodization results in the realization of a uniform oxide thickness on the semiconductor, e.g. Si, surfaces exposed to the anodization electrolyte. The thickness of the oxide layer is defined by the anodization voltage between the cathode and the anode, which defines the anodization current.

Anodization also results in the simultaneous reduction of the surface roughness. Etching of vertical trenches or vias in semiconductor material, for example in Si, typically results in rough sidewalls (scallops). Sharp surface features on the semiconductor surfaces, e.g. Si-surfaces, (e.g., the scallops) result locally in higher electro-static fields, accelerating the anodic oxidation process at those locations and therefore smoothening the surface in a natural way.

Embodiments of the present disclosure propose to use an anodization process to provide oxide layers on or in a three-dimensional (3D) structure formed on or in a semiconductor substrate.

Hereinafter, a method according to embodiments of the disclosure will be described by means of an example and with respect to FIG. 1 to FIG. 4. It has to be understood that this is only for the ease of explanation and that this example is not intended to limit the disclosure in any way. The method according to embodiments of the disclosure may be used for providing oxide layers in any 3D structure on a substrate, as long as the substrate and/or 3D structure comprise a conductive material such as a metal or a semiconductor material.

In a first step, a device substrate 1a, for example a Si substrate, is provided. On the device substrate 1a, a dielectric insulating layer 3, such as an oxide or a nitride is provided. The dielectric insulating layer 3 may consist of a single layer or a plurality of layers. Near the interface between the device substrate 1a and the dielectric insulating layer 3, active device such as for example transistors (not illustrated) may be provided in the device substrate 1a, e.g. the front end of line. In alternative embodiments, the device substrate 1a could be a passive substrate. At the other side of the dielectric insulating layer 3, a multilayer interconnect structure 1b is provided, comprising insulating and interconnect layers, e.g. the back end of line of a device wafer, or the build-up layers of a semiconductor interposer (MCM) substrate. One contact 2 of such multilayer interconnect structure is in FIG. 1 schematically illustrated and indicated by reference number 2. If the device substrate 1a is thin, the substrate 1 formed by the plurality of layers and devices as mentioned above may optionally be attached to a carrier substrate 4.

The substrate 1 may have a thickness of smaller than about 300 μm, and may, for example, have a thickness of between about 50 μm and 300 μm. According to embodiments of the disclosure any substrate may be used as long as it can conduct an electrical current and can be oxidized, such as e.g. a semiconductor substrate, in particular a silicon substrate. For example, the substrate 1, and more particularly device substrate 1a thereof, which is the part which will be anodized, may comprise low resistivity silicon. The low resistivity silicon may have a resistivity of about 30 μOhm.cm or lower, the disclosure however not being limited thereto. For this purpose, for example n- or p-doped semiconductor material such as n- or p-doped silicon may be used.

Figure 2:
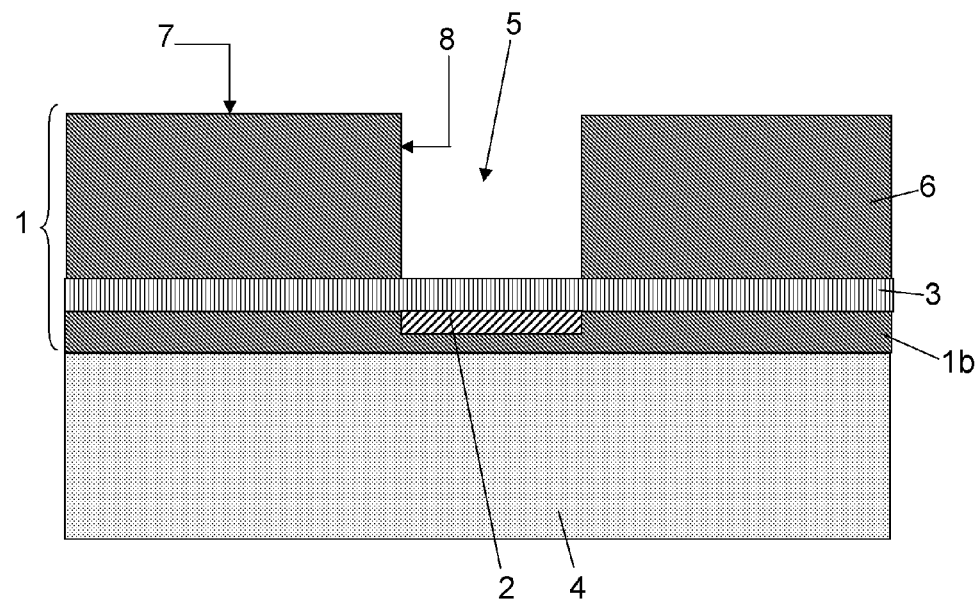

Using appropriate semiconductor techniques holes 5, as illustrated in FIG. 2, may be etched from the backside of the semiconductor device wafer 1a to the insulating layer 3. A typical technique would be to use an ICP-RIE plasma etching technique to obtain sloped or straight sidewalls 8. These holes 5 may have a variety of shapes: circular, polygons, ring shapes or trenches to name only a few.

Figure 12:
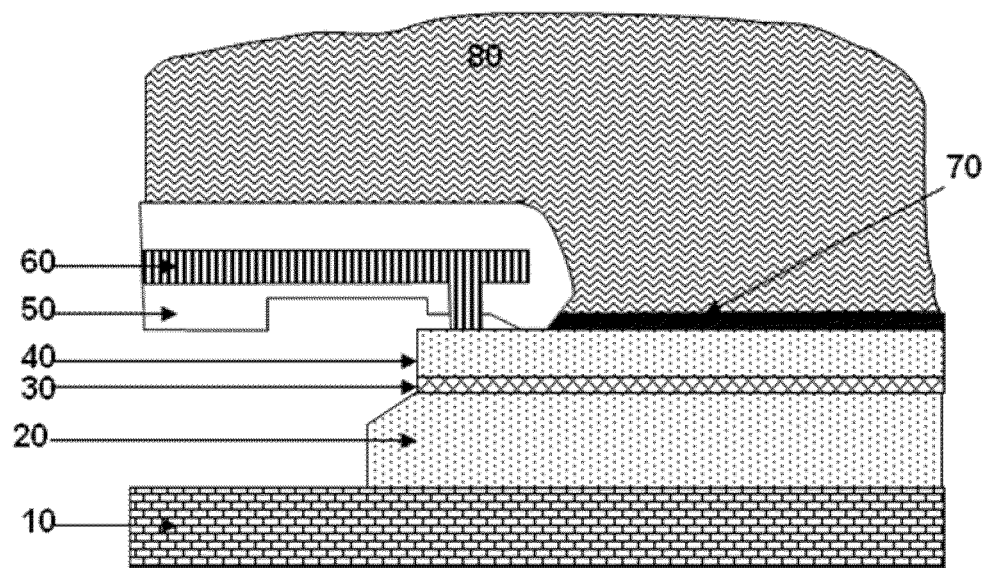
FIG. 12 illustrates an electrode configuration which may be used with embodiments of the present disclosure.

Next, anodization may be performed. Therefore, the substrate 1 may be immersed in an acidic electrolyte solution, and a potential may be applied between a cathode located in the electrolyte solution and an anode formed on or by the substrate 1. The applied potential may be between about 10 V and 400 V. According to embodiments of the disclosure, the material of the substrate 1, in particular the device substrate 1a, itself may act as an anode. According to other embodiments of the disclosure, an anode may be formed on the substrate 1 such that it makes electrical contact to the conductive material of the substrate 1. In the latter case, a contact ohmic resistance of between about 10 kΩ and 100 kΩ may exist between the electrode and the substrate 1. This contact may be realized with a distributed set of electrodes embedded in a plastic mould able to protect the contact from the acid solution. An example of such electrode is illustrated in FIG. 12. The electrode 60 illustrated in FIG. 12 may be only one of a plurality of distributed electrodes. The electrode 60 is covered by a contact seal ring 50 which prevents direct contact between the electrode 60 and the surrounding electrolyte solution 80, so that the electrode 60 cannot be contaminated or destroyed by the acidic electrolyte solution. The contact seal ring 50 is of a material suitable for protecting the electrode 60 against the acidic impact of the electrolyte solution. The electrode 60 is in electrical contact with the substrate 40, for example a thin semiconductor wafer, at the front side thereof, i.e. at the same side as where an oxide layer 70 will be provided by anodization in accordance with embodiments of the present disclosure. For ease of handling, the substrate 40 to be oxidized may be attached onto a carrier wafer 20, for example by means of a temporary glue 30. During the anodization process, the substrate 40, optionally provided onto and temporarily attached to the carrier wafer 20, may be placed onto a holder chuck 10.

It is particularly advantageous to use the device substrate 1a itself as a distributed electrode. This way, no anode needs to be provided at the back of the substrate 1, which in the example illustrated would be at the back of the carrier substrate 4.

Figure 3:
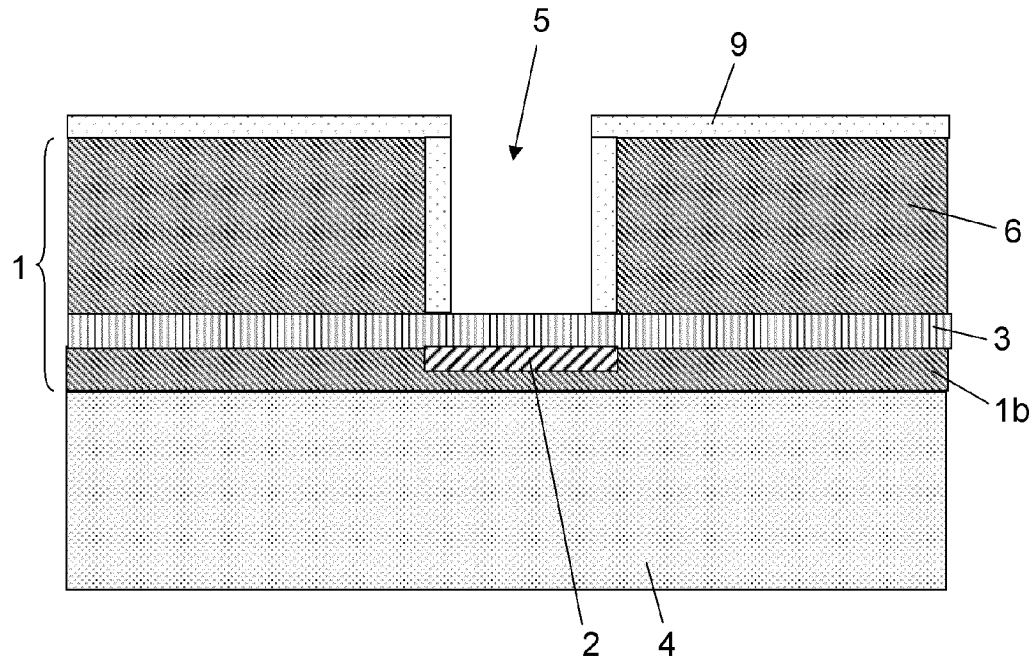
Figure 4:
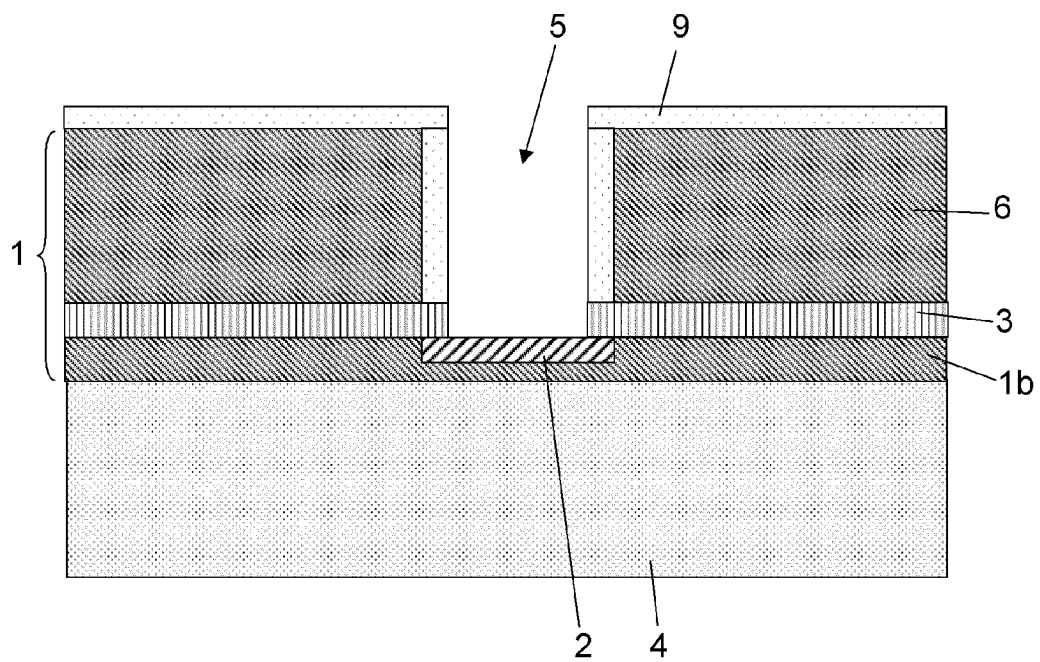

The electrolyte solution may, for example, comprise citric acid, acetic acid, oxalic acid, sulfuric acid, phosphoric acid nitric acid or a combination thereof. By applying a voltage to the substrate 1, a current will pass through the electrolyte solution thereby causing anodization of conductive material in contact with the electrolyte solution. As a consequence, a silicon oxide layer 9 is formed on all exposed silicon surfaces, e.g. the major surface 7 as well as the side walls 8 of the 3D structure, (FIG. 3).

It can be seen that the anodization process is selective towards the insulator 3. This means that the oxide will only be formed at exposed conductive substrate material, substantially not on neighboring non-conductive or non-conducting materials.

It has to be understood that the provision of an oxide layer 9, e.g. silicon oxide layer on the major surface 7 and side walls 8 is only an example and that, according to other embodiments of the disclosure, the method also may be used to, for example, provide an oxide layer 9, e.g. silicon oxide layer, only at the side walls 8 of the at least one hole 5. This may be performed by, for example, first providing an insulating layer to the major surface 7 of the 3D structure and then anodizing the non-covered parts, i.e. the side walls 8 of the at least one hole 5 so as to form the oxide layer 9, e.g. silicon oxide layer on the side walls 8 of the at least one hole 5.

Anodization is a self limiting process, which means that there exists an equilibrium between the potential that is applied for anodization and the resulting thickness of the oxide layer 9 formed. According to embodiments of the disclosure it may be possible to form oxide layers 9 with a thickness up to about 200 nm. According to embodiments and depending on the required thickness of the oxide layer 9, e.g. silicon oxide layer, anodization may be performed during a time period between about 10 min and 10 hours.

According to embodiments of the disclosure, the anodization process may be a two-step process. In a first phase, a potential may be applied between the cathode and anode such that a fixed current density is obtained which allows forming of the oxide layer 9. In a second phase, the applied potential may be a fixed potential which allows healing the formed oxide layer 9, e.g. silicon oxide layer. With healing of the oxide layer 9, e.g. silicon oxide layer, is meant removal of defects such as pinholes so as to obtain an oxide layer of good quality. In particular embodiments, a stoichiometric oxide may be obtained, which exhibits good quality features.

With the method according to embodiments of the disclosure it may also be possible to form porous oxide layers 9, e.g. silicon oxide layers. In that case, the current density may be changed as a function of time during anodization.

In a next step, the insulating layer 3 at the bottom of the at least one hole 5 may be removed so as to expose the contacts 2 underneath. This may be done by any suitable technique known by a person skilled in the art, for example by selective etching. In this case the insulating layer 3 should preferably be selectively etchable with respect to the formed oxide layer 9. The at least one hole or via 5 may then optionally be filled with a conductive material.

A method according to embodiments of the disclosure may be used in semiconductor processing. For example, a method according to embodiments of the disclosure may be used to form a liner of a through-silicon-via, also referred to as via isolation. Because the formation of the oxide layer 9, e.g. silicon oxide layer, occurs at predetermined locations, in the example given on the major surface 7 of the 3D structure and on the sidewalls 8 of the at least one hole or via 5, no patterning step is required to pattern the formed oxide layer 9, in the example given silicon oxide layer, so as to remove the part of the oxide layer 9, in the example given silicon oxide layer from the bottom of the at least one hole or via 5.

A method according to embodiments of the disclosure may be used for providing oxide layers 9, e.g. silicon oxide layers, in vias 5 with high aspect ratio, which may be defined as the width-to-height ratio, e.g. with an aspect ratio below about 5, for example an aspect ratio of between about 0.01 and 5.

Hereinabove, the method according to embodiments of the disclosure was described by means of anodization of semiconductor material. It has to be understood that also other conductive materials such as metals can be anodized during the process. In other words, formation of an oxide layer with a method according to embodiments of the disclosure may be applied to any 3D structure formed on or in a semiconductor material and optionally comprising a metal.

The oxide layer 9, e.g. silicon oxide layer formed by a method according to embodiments of the disclosure has a normal stoichiometry, i.e. has a same stoichiometry as oxide layers formed by conventional methods. In the particular example of silicon oxide being formed, this means that the oxide layer consists of $SiO_2$ and does not comprise SiO.

The oxide layer 9, e.g. silicon oxide layer formed by a method according to embodiments of the present disclosure exhibits minimum quality that may be required for 3D integration. However, the oxide layers 9, e.g. silicon oxide layer formed by a method according to embodiments are less suitable for being used as a gate oxide.

It has been shown in case of silicon that when a Si surface is treated with the method according to embodiments of the disclosure, i.e. when a silicon oxide layer is formed using a method according to embodiments of the disclosure, a surface may be obtained with hydrophilic properties. These properties may be used in order to ease the application of lithographic products on the wafer surface.

With a method according to embodiments of the disclosure, oxide layers, e.g. silicon oxide layers may be formed on a 3D structure on a semiconductor substrate, e.g. at sidewalls of trenches or holes or vias 5 in and/or at a major surface of a three-dimensional structure. A method according to embodiments of the present disclosure does not always require additional steps, such as e.g. photolithography steps, for patterning the formed oxide layer, thereby removing the oxide at locations where no oxide is wanted.

A method according to embodiments of the disclosure may be applied at room temperature, thereby avoiding problems that can arise with, for example, glue layers, during heating.

With a method according to embodiments of the disclosure, continuous and conformal oxide layers may be obtained.

EXAMPLE

An experiment was performed in which a silicon oxide layer 9 was provided into a silicon hole or via 5. Therefore a silicon wafer 1 was provided. The silicon wafer 1 was provided with through-silicon-vias 5 having a high aspect ratio of 0.1 (diameter of 5 μm and depth of 50 μm). The silicon wafer 1 was cleaned with a HF solution in order to ensure low contact resistance.

As an electrolyte solution for the anodization reaction, a 0.1% citric acid solution was used. An anodization potential of 40 V was applied. A current density of 5 mA/cm$^2$ was achieved. Anodization was performed during a time period of 10 hours. A silicon oxide layer 9 with a thickness of 70 nm was obtained.

FIG. 6 to FIG. 11 show pictures of the resulting oxide layer in the hole 5. The oxide layer had a thickness of 70 nm.

Figure 6:
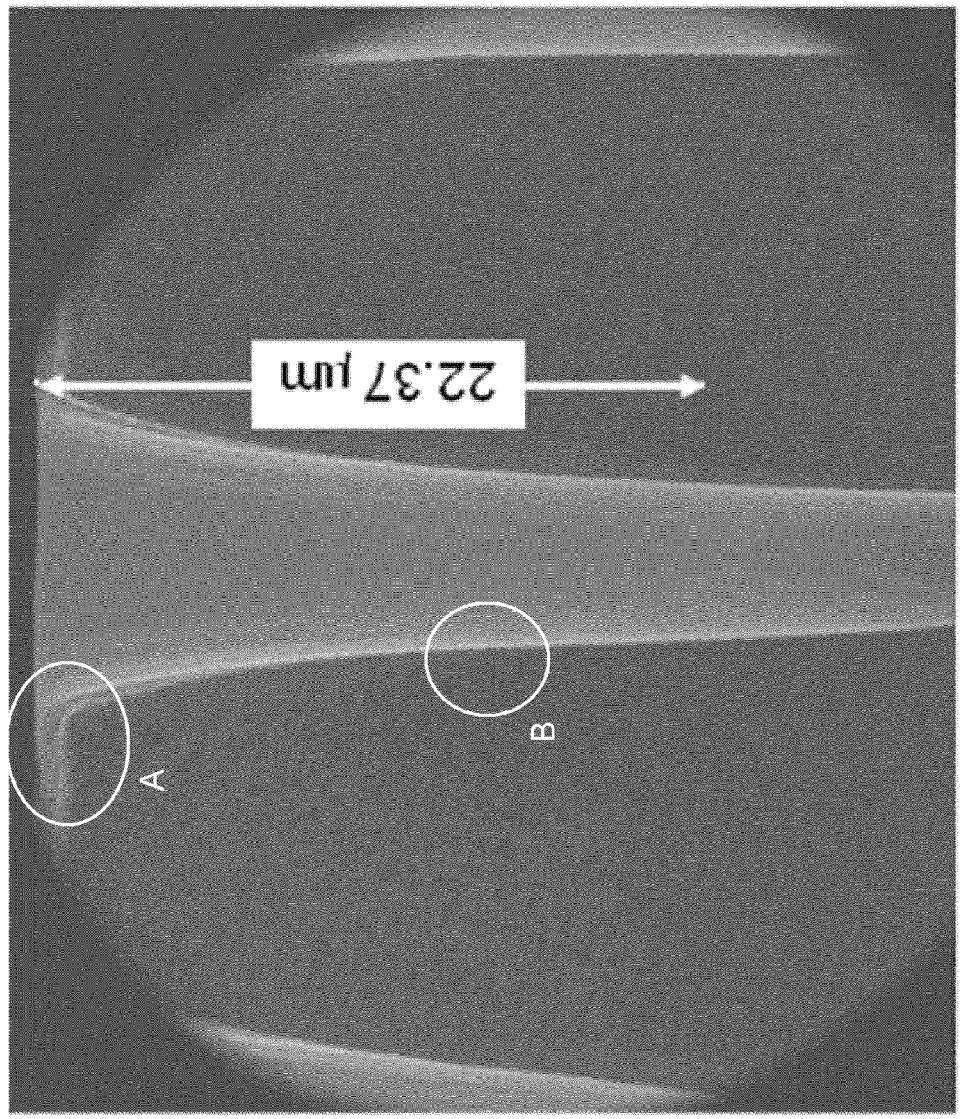
FIG. 6 to FIG. 11 show SEM photo's of an oxide layer formed by a method according to embodiments of the disclosure.
Figure 7:
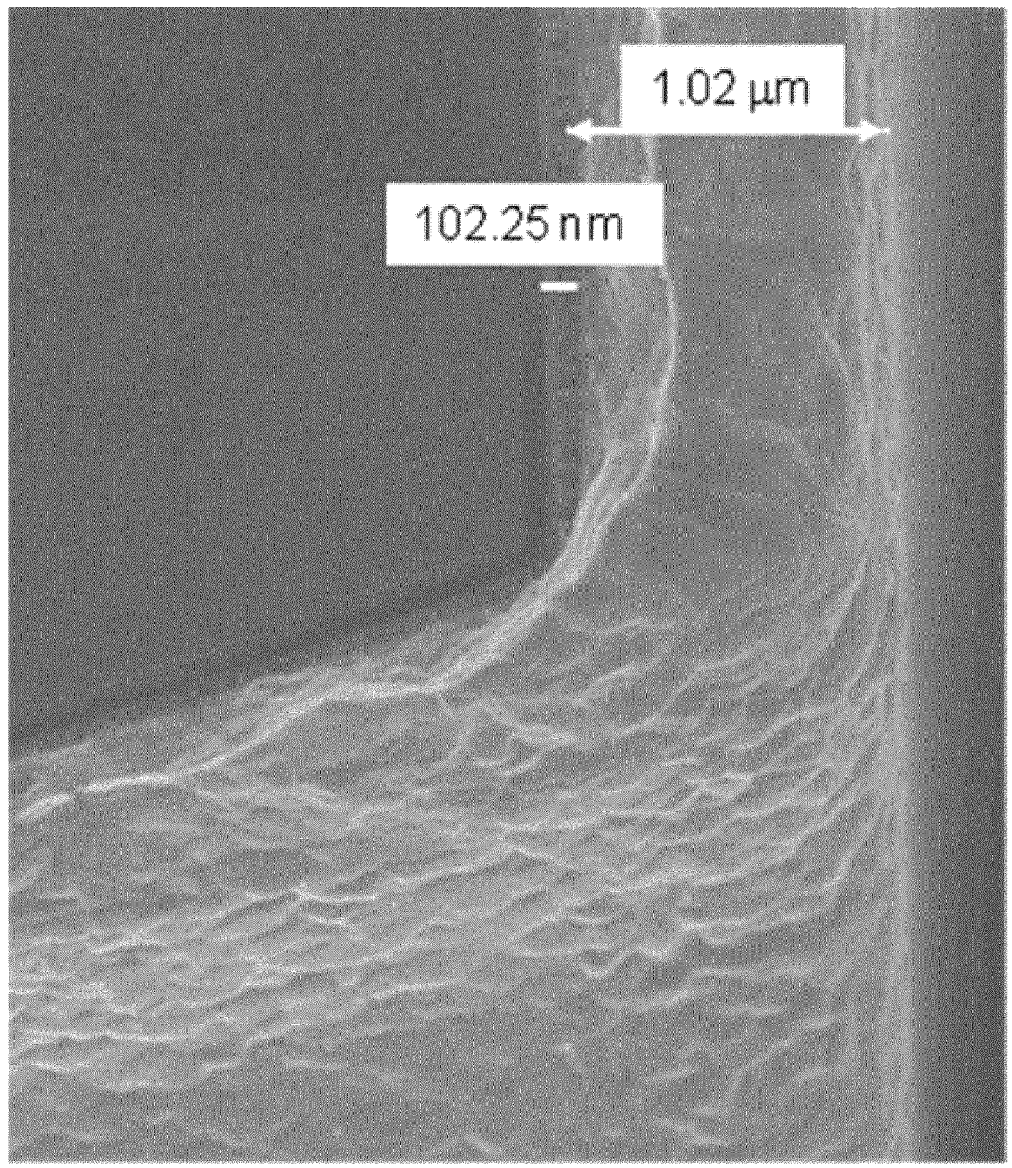
Figure 8:
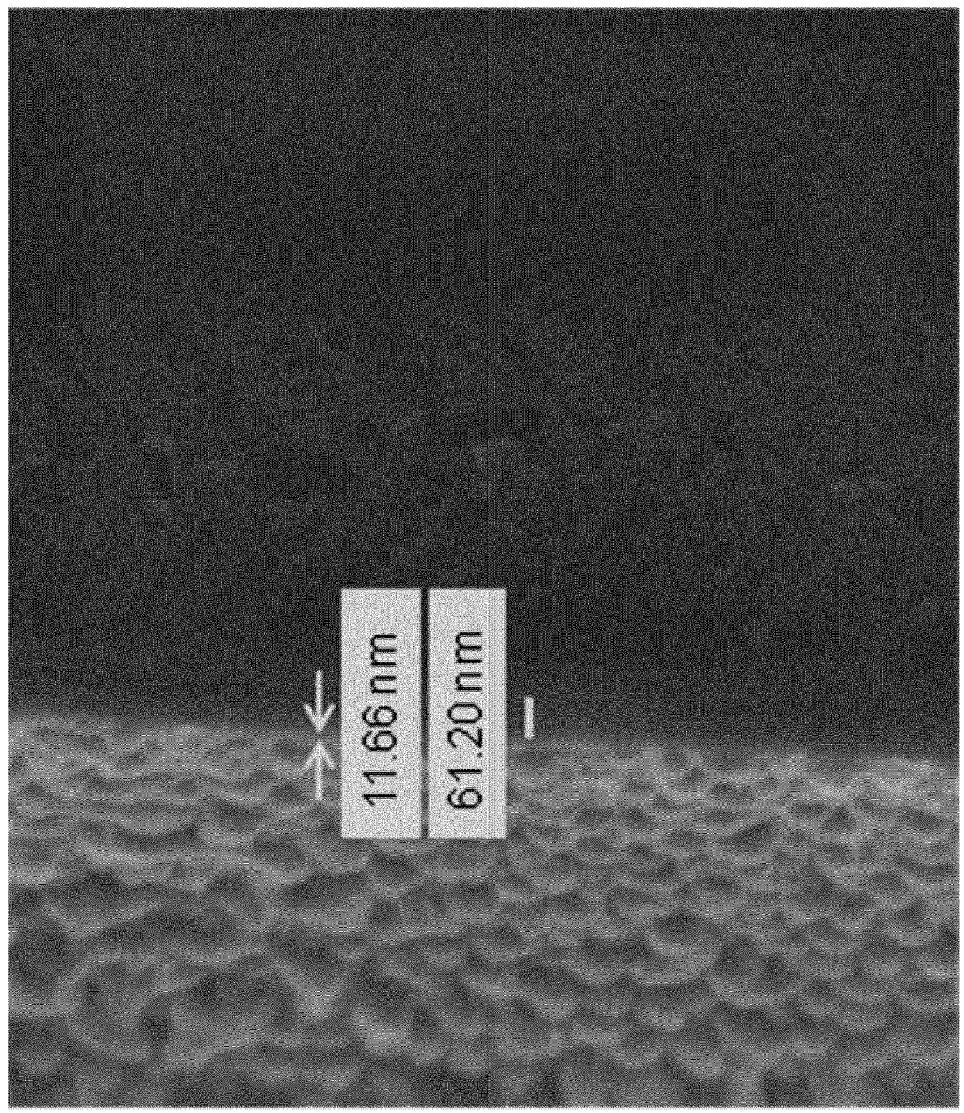
Figure 9:
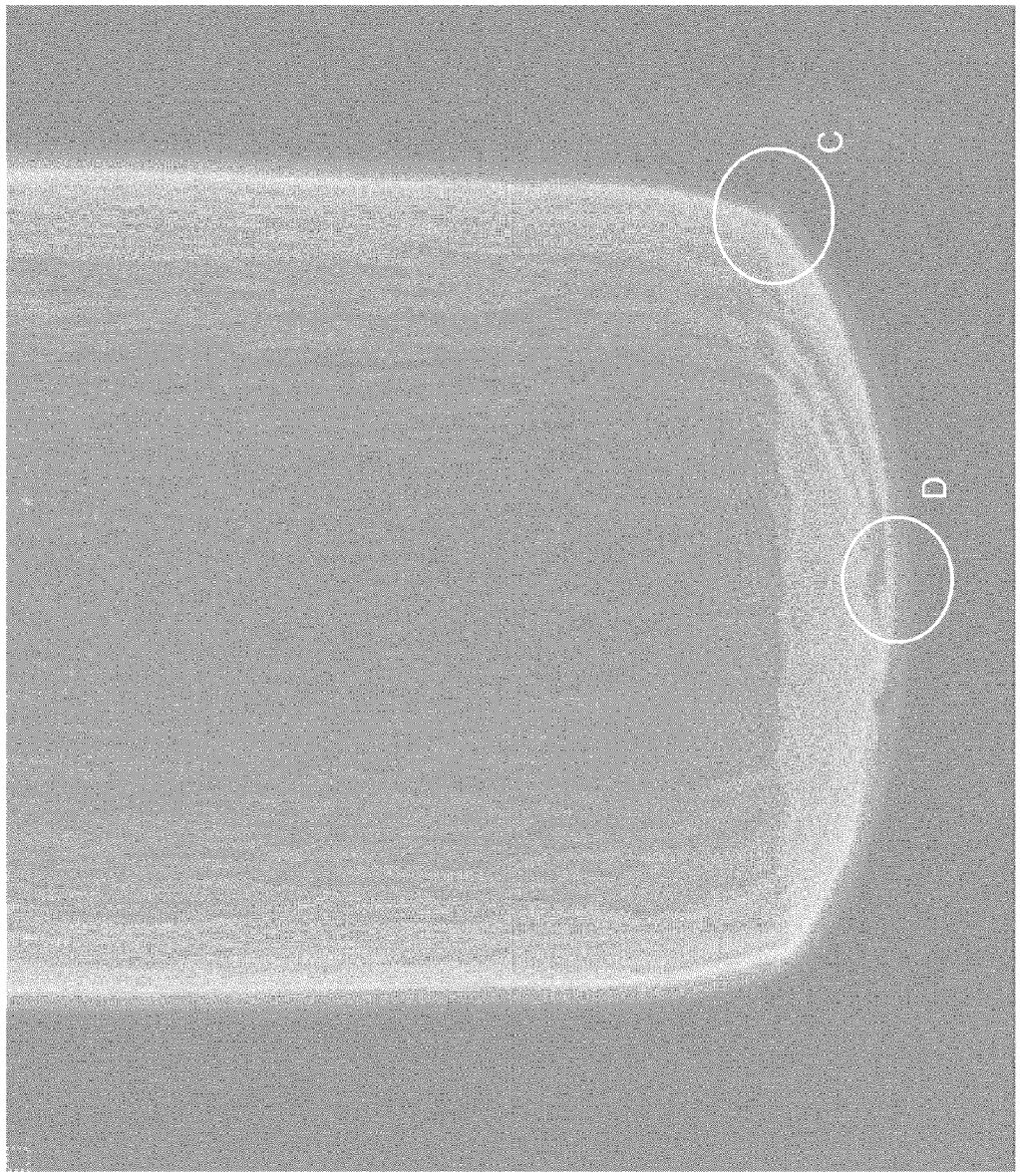
Figure 10:
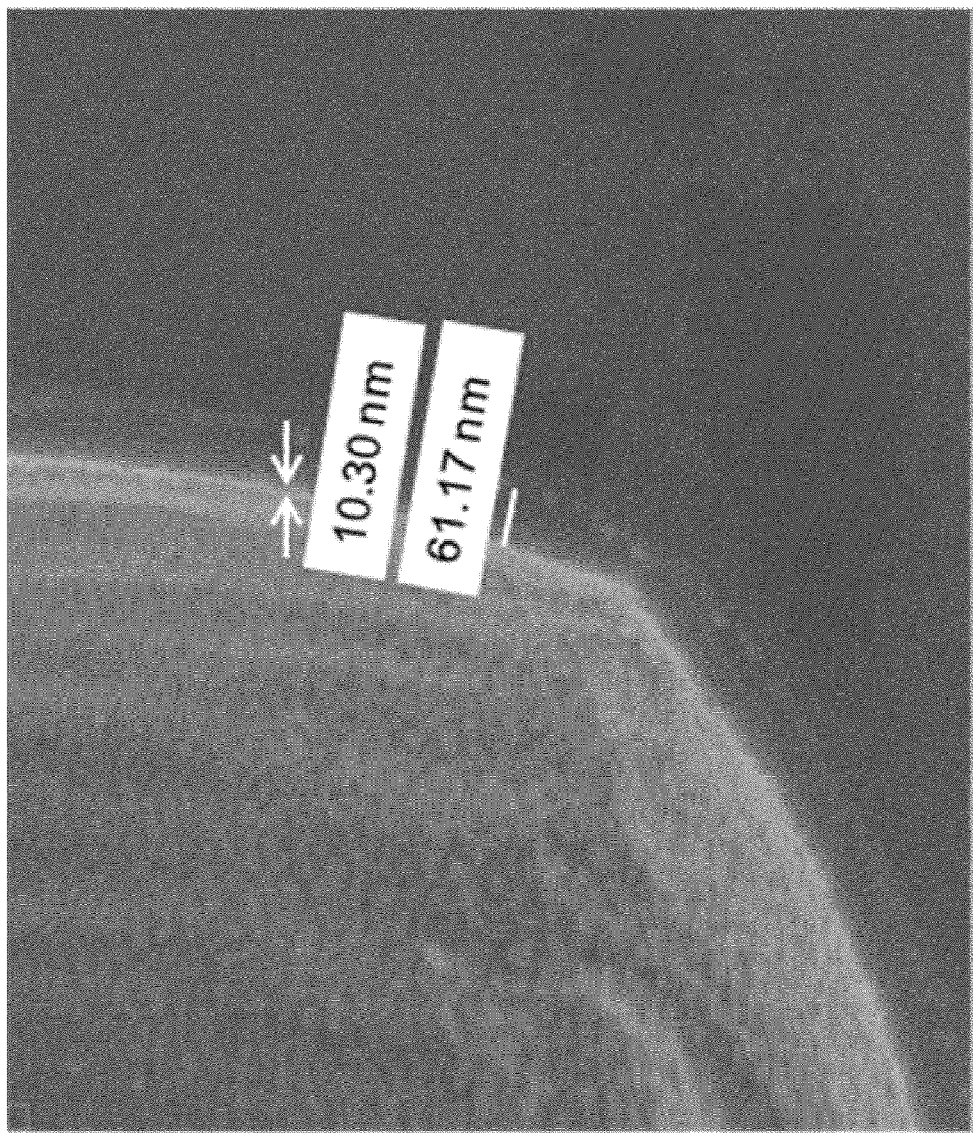
Figure 11:
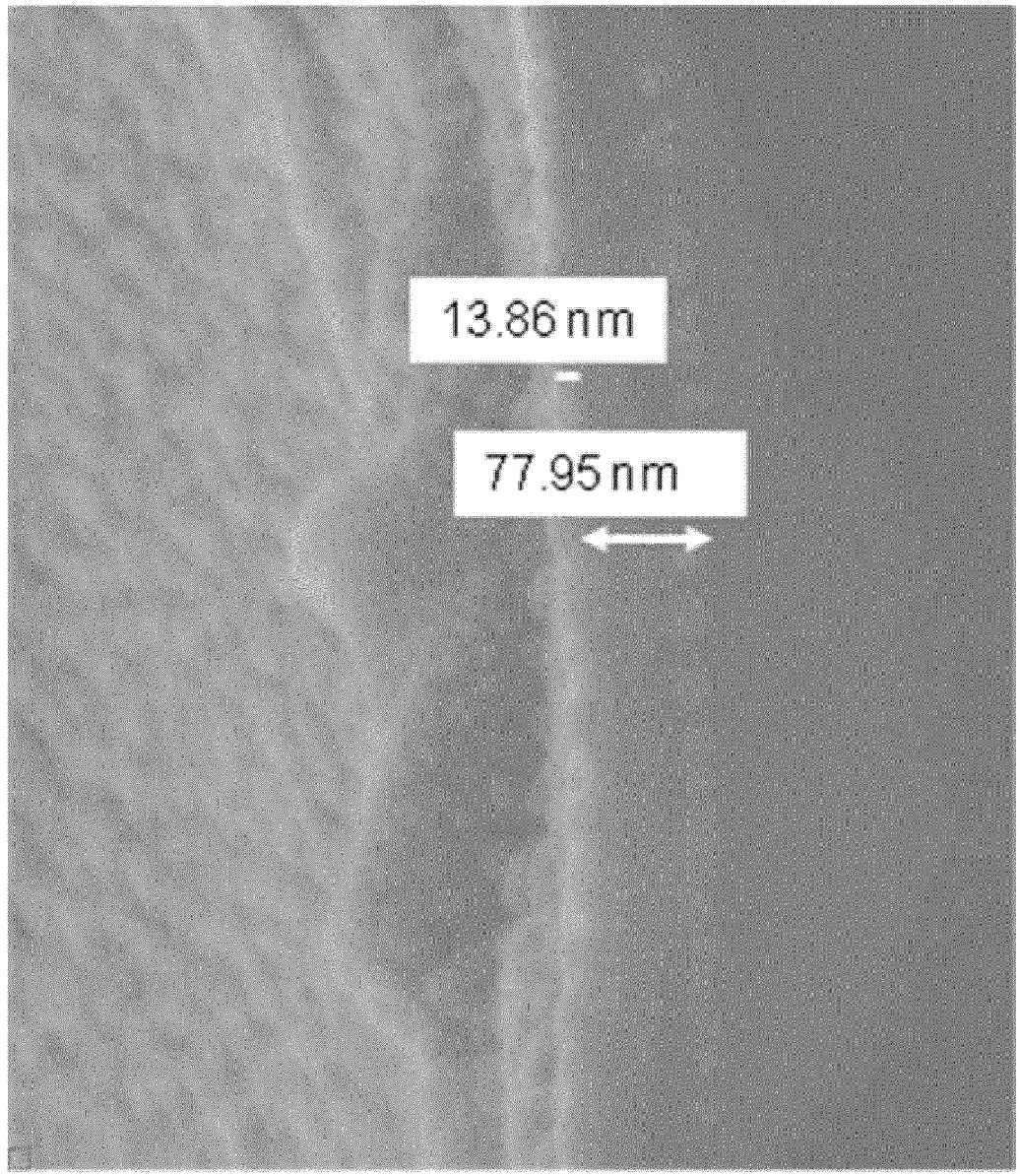

FIG. 7 shows the detail indicated A in FIG. 6.
FIG. 8 shows the detail indicated B in FIG. 6.
FIG. 9 shows the bottom of the hole 5.
FIG. 10 shows the detail indicated C in FIG. 9.
FIG. 11 shows the detail indicated D in FIG. 9.

From these pictures it can be seen that a uniformly grown oxide layer of 70 nm thickness is obtained. The thickness of the oxide is uniform all along the high aspect ratio hole (5 μm wide, 50 μm deep—aspect ratio 0.1).

As can be seen from the pictures a continuous and conformal silicon oxide layer was obtained in such high aspect ratio via 5.

It is to be understood that although embodiments, specific constructions and configurations, as well as materials, have been discussed herein for devices according to the present disclosure, various changes or modifications in form and detail may be made without departing from the scope of this disclosure as defined by the appended claims.

Figure 5:
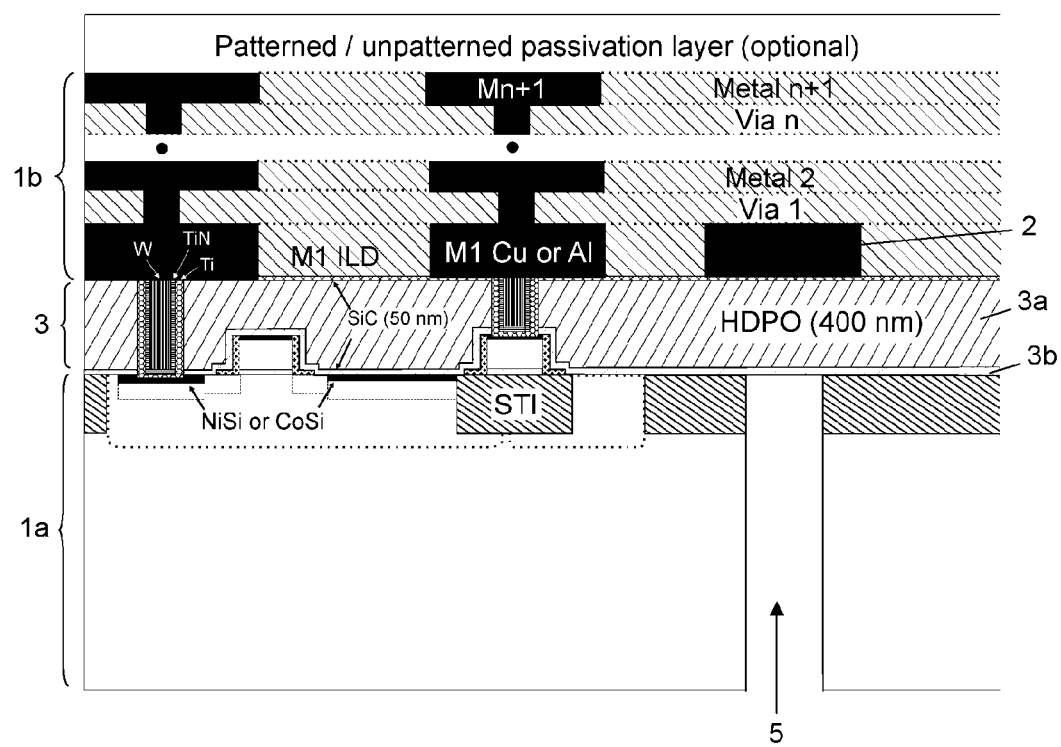
FIG. 5 illustrates an example of a device to which a method according to embodiments of the disclosure can be applied.

An example of a device of which the manufacturing process may comprise a method according to embodiments of the disclosure is illustrated in FIG. 5. According to this example, part 1a of the substrate 1 may comprise isolation zones such as STI zones which are well known by a person skilled in the art. Part 1b of the substrate 1 may comprise a plurality of vias via1, . . . , via n and a plurality of metal layers M1, . . . , Mn+1 to form contacts 2. In between part 1a and part 1b, an insulating layer 3 is present. According to the present example, the insulating layer 3 may be formed of a first layer 3a and a second layer 3b. The first layer 3a may, for example, comprise HDPO (high density plasma oxide) with a thickness of, for example, in the example illustrated, 400 nm. The second layer 3b may, for example, comprise SiC with a thickness of, for example, in the example illustrated, 50 nm. As can be seen from FIG. 5, the SiC layer 3b acts as an etch stop when etching the at least one hole or via 5 in part 1a of the substrate 1. An oxide layer can be applied in the hole or via 5 as in accordance with embodiments of the present disclosure.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of providing an oxide layer on a semiconductor substrate, the method comprising:
   providing a semiconductor substrate, wherein the semiconductor substrate comprises:
   a device substrate formed of a doped semiconductor material and comprising isolation zones formed therein, the isolation zones comprising an isolation dielectric material,
   a multilayer interconnect structure formed over the device substrate, and
   an insulating layer interposed between the device substrate and the multilayer interconnect structure, wherein the insulating layer at least partially overlaps the isolation zones when viewed in a direction perpendicular to a major surface of the device substrate, and wherein the insulating layer contacts the isolation zones in an overlapping area;
   providing at least one hole at a backside of the device substrate to the insulating layer through one of the isolation zones; and
   after providing the semiconductor substrate and the at least one hole, anodizing the semiconductor substrate in an acidic electrolyte solution, wherein the anodizing process forms an oxide layer on the semiconductor substrate, wherein the anodizing process comprises:
   immersing the semiconductor substrate in the electrolyte solution; and
   applying a potential between a cathode located in the electrolyte solution and the device substrate being used as an anode, thereby forming the oxide layer on those locations where the semiconductor substrate has the anode exposed to the electrolyte solution; and
   wherein anodization is performed by a two-step process, wherein applying a potential is performed such that first a fixed current density is obtained through the semiconductor substrate for a predetermined time period; and
   after the predetermined time period, a fixed potential is applied.

2. The method according to claim 1, wherein anodizing the semiconductor substrate in an acidic electrolyte solution comprises immersing the semiconductor substrate in an electrolyte solution which comprises citric acid, acetic acid, oxalic acid, sulfuric acid, phosphoric acid, nitric acid, or a combination thereof.

3. The method according to claim 1, wherein anodizing the semiconductor substrate in an acidic electrolyte solution comprises immersing the semiconductor substrate in an electrolyte solution with an acid concentration between about 0% (not included) and 20%.

4. The method according to claim 1, wherein forming an oxide layer on the semiconductor substrate comprises forming an oxide layer at side walls of the at least one hole.

5. The method according to claim 1, wherein applying a potential is performed by applying a potential between about 10 V and 400 V.

6. The method according to claim 1, wherein applying a potential is performed by applying a potential so as to change current density through the semiconductor substrate as a function of time.

7. The method according to claim 1, wherein the method is performed at a temperature below about 80° C.

8. The method according to claim 1, wherein the hole is a through-substrate via.

9. The method according to claim 1, wherein the hole has a cylindrical shape.

10. The method according to claim 1, wherein the hole has a donut shape.

11. A method of manufacturing semiconductor devices comprising the method of providing an oxide layer according to claim 1.

12. The method according to claim 1, wherein the process of forming the oxide layer on the semiconductor substrate is performed at room temperature.

13. The method according to claim 1, wherein the process of forming the oxide layer on the semiconductor substrate is performed at a temperature below about 80° C.

14. A method of providing an oxide layer on a semiconductor substrate, the method comprising:
   providing semiconductor substrate, wherein the semiconductor substrate comprises:
   a device substrate formed of a doped semiconductor material and comprising isolation zones formed therein, the isolation zones comprising an isolation dielectric material,
   a multilayer interconnect structure formed over the device substrate, and
   an insulating layer interposed between the device substrate and the multilayer interconnect structure, wherein the insulating layer at least partially overlaps the isolation zones when viewed in a direction perpendicular to a major surface of the device substrate, and wherein the insulating layer contacts the isolation zones in an overlapping area;
   providing at least one hole at a backside of the device substrate to the insulating layer through one of the isolation zones; and
   after providing the semiconductor substrate and the at least one hole, anodizing the semiconductor substrate in an acidic electrolyte solution, wherein the anodizing process forms an oxide layer on the semiconductor substrate, wherein the anodizing process comprises:
immersing the semiconductor substrate in the electrolyte solution; and
applying a potential between a cathode located in the electrolyte solution and an anode electrode formed on the semiconductor substrate making electrical contact to the device substrate, thereby forming an oxide layer on those locations where the semiconductor substrate has an anode exposed to the electrolyte solution, wherein at least part of the anode including the anode electrode is embedded in a plastic mold and covered by a contact seal ring, thereby preventing direct contact between the at least part of the anode embedded in the plastic mold and the acidic electrolyte solution; and
wherein anodization is performed by a two-step process, wherein applying a potential is performed such that
first a fixed current density is obtained through the semiconductor substrate for a predetermined time period; and
after the predetermined time period, a fixed potential is applied.

15. The method of claim 14 wherein anodizing the semiconductor substrate further includes anodizing the backside of the device substrate while protecting a front surface of the device substrate from being exposed to the acidic electrolyte solution.

16. A method of forming an oxide layer on a semiconductor substrate, the method comprising:
providing a semiconductor substrate comprising:
a semiconductor device substrate having a first major surface and a second major surface opposite the first surface, wherein the semiconductor device substrate is formed of a doped semiconductor material and comprises isolation zones formed therein, the isolation zones comprising an isolation dielectric material;
a multilayer interconnect structure formed over the first major surface of the semiconductor device substrate, and;
an insulating layer formed over the first major surface and interposed between the device substrate and the multilayer interconnect structure, wherein the insulating at least partially overlaps the isolation zones when viewed in a direction perpendicular to the first major surface of the semiconductor device substrate, and wherein the insulating layer contacts the isolation zones in an overlapping area;
forming at least one hole from the second major surface of the semiconductor device substrate through the semiconductor device substrate and further through one of the isolation zones; and
after providing the semiconductor device substrate and forming the at least one hole, forming an oxide layer by anodizing the second major surface of the semiconductor device substrate and further anodizing sidewalls of the at least one hole, anodizing comprising:
immersing the semiconductor substrate to expose the second surface of the semiconductor device substrate in an acidic electrolyte; and
applying a potential between a cathode located in the electrolyte solution and the semiconductor device substrate being used as an anode; and
wherein anodization is performed by a two-step process, wherein applying a potential is performed such that
first a fixed current density is obtained through the semiconductor substrate for a predetermined time period; and
after the predetermined time period, a fixed potential is applied.

17. The method of claim 16 where forming an oxide layer includes protecting the first surface of the semiconductor device substrate from being exposed to the acidic electrolyte solution.

* * * * *

UNITED STATES PATENT AND TRADEMARK OFFICE
CERTIFICATE OF CORRECTION

| | | |
|---|---|---|
| PATENT NO. | : 8,822,330 B2 | Page 1 of 1 |
| APPLICATION NO. | : 12/906766 | |
| DATED | : September 2, 2014 | |
| INVENTOR(S) | : Philippe Soussan | |

It is certified that error appears in the above-identified patent and that said Letters Patent is hereby corrected as shown below:

Title page (item 75, Inventors) at line 1, Change "Marseilles, FR" for Philippe Soussan to --Marseille, FR--.

Title page (item 75, Inventors) at line 3, Change "Purteaux, FR" for Philippe Muller to --Puteaux, FR--.

In the Specification

In column 1 at line 25, Change "know" to --known--.

In the Claims

In column 13 at lines 33-34, In Claim 16, change "first surface," to --first major surface,--.

Signed and Sealed this
Twenty-third Day of June, 2015

Michelle K. Lee
*Director of the United States Patent and Trademark Office*